United States Patent [19]

Tateishi

[11] Patent Number: 4,857,866
[45] Date of Patent: Aug. 15, 1989

[54] PHASE-LOCKED LOOP HAVING ELONGATED TIME FOR CHARGE AND DISCHARGE

[75] Inventor: Hisao Tateishi, Tokyo, Japan

[73] Assignee: NEC Corporation, Tokyo, Japan

[21] Appl. No.: 232,981

[22] Filed: Aug. 17, 1988

[30] Foreign Application Priority Data

Aug. 17, 1987 [JP] Japan .................. 62-204715

[51] Int. Cl.$^4$ .......... H03L 7/06; H03L 7/08; H03L 7/18
[52] U.S. Cl. ...................... 331/1 A; 331/8; 331/25
[58] Field of Search .......... 331/1 A, 8, 16, 25; 375/81, 120; 455/260; 307/269, 511, 514, 516, 525, 526, 527, 528; 328/55, 133, 155; 360/36.1, 36.2, 51

[56] References Cited

U.S. PATENT DOCUMENTS 4,750,193 6/1988 Bailey .................. 331/1 A X

Primary Examiner—David Mis
Attorney, Agent, or Firm—Foley & Lardner, Schwartz, Jeffery, Schwaab, Mack, Blumenthal & Evans

[57] ABSTRACT

A phase-locked loop circuit comprises a controlled oscillator receiving a control signal for generating an oscillation signal of a frequency corresponding to the received control signal, and a frequency divider receiving the oscillation signal for generating a signal having a frequency divided by a given frequency division ratio. A phase detector receives an input signal and the frequency-divided signal. This phase detector generates a first phase difference signal starting at the input signal and terminating at one of a rising edge of the frequency-divided signal. The phase detector also generates a second phase difference signal having a constant pulse width in an interval period between each pair of adjacent first phase difference signals without substantially overlapping the first phase difference signal. A charge pump responds to the first phase difference signal to generate a first control signal for changing the oscillation frequency of the controlled oscillator in a first direction, and also responds to the second phase difference signal to generate a second control signal for changing the oscillation frequency of the controlled oscillator in a second direction opposite to the first direction.

9 Claims, 7 Drawing Sheets

PHASE-LOCKED LOOP HAVING ELONGATED TIME FOR CHARGE AND DISCHARGE

BACKGROUND OF THE INVENTION

1. Field of the Invention

The present invention relates to a phase-locked loop circuit, and more specifically to a phase-locked loop circuit for use in a data reading of magnetic disc devices such as floppy disc devices and hard disc devices.

2. Description of Related Art

At present, phase-locked loop circuits have been widely used for reading circuits for magnetic disc devices such as floppy disc devices and hard disc devices. Conventional phase-locked loop circuits have been composed of a one-shot multivibrator receiving a read data signal for generating a one-shot pulse signal in synchronism with a rising edge or falling edge of the read signal. The reading signal is also supplied to set a reset-set flipflop which is reset by an output of a frequency divider. The one-shot signal and an output of the flipflop are phase-compared in a phase detector, which in turn generates a charge-up signal or a discharge-down signal to a charge pump. An output of the charge pump is connected though a low pass filter to a voltage controlled oscillator, whose output is connected to the frequency divider. With this, a phase-locked loop is completed.

In the case that the above mentioned phase-locked loop circuit is incorporated in a data reading circuit for a floppy disc device which can selectively assume various data transfer rates, the frequency division ratio of the frequency divider is selectively set to different values corresponding to the various data transfer rates, and at the same time, the one-shot multivibrator is also set so that the pulse width of each one-shot pulse can be adjusted in correspondence to the data transfer rates.

Under the above mentioned circumstance, when the phase-locked loop circuit operates at a relatively low data transfer rate, the conventional circuit has been encountered with such a disadvantage that the reading precision is deteriorated due to a phase error attributable to a quantization error (in clock) generated in a digital counter. Conventionally, in order to prevent the deterioration of the reading precision, it was to use an multivibrator whose output width can be adjusted by an external resister or capacitor circuit.

In addition, the change of the frequency division ratio could not comply with different high data transfer rates of 1 Mbps or more, and therefore, to comply a plurality of high data transfer rates, the conventional phase-locked loop circuits have to include one one-shot multivibrator for each of all the data transfer rates, and accordingly, a correspondingly number of sets of external resister and capacitor have to be provided.

Furthermore, in the proximity of zero phase difference, the charge-up signal and the discharge-down signal of the phase detector has a very narrow pulse width. However, a very narrow pulse signal will disappear while it is transferred through the charge pump, if the signal transfer system does not have a sufficient transmission power. Because of this, there exists a region in which a phase difference cannot apparently be detected, and therefore, after the phase-locked loop circuit is locked, a jitter appears in the oscillation frequency of the voltage controlled oscillator, with the result that the circuit becomes unstable.

SUMMARY OF THE INVENTION

Accordingly, it is an object of the present invention to provide a phase-locked loop circuit which has overcome the above mentioned defect of the conventional one.

Another object of the present invention is to provide a phase-locked loop circuit capable of complying with a plurality of high data transfer rates without substantial additional circuit.

Still another object of the present invention is to provide a phase-locked loop circuit having no one-shot multivibrator and capable of complying with a plurality of high data transfer rates only by changing the frequency division ratio of of a frequency divider.

A further object ofthe present invention is to provide a phase-locked loop circuit generating a charge-up signal and a discharge-down signal even at the time of no phase difference, so as to able to adjust any phase difference in the proximity of no phase difference.

A still further object of the present invention is to provide a phase-locked loop circuit capable of eliminating a region in which a phase difference cannot apparently be detected because of insufficient transmission power of a signal transmission power system, so that a jitter of the oscillation frequency is reduced.

The above and other objects of the present invention are achieved in accordance with the present invention by a phase-locked loop circuit which comprises a controlled oscillator receiving a control signal for generating an oscillation signal of a frequency corresponding to the received control signal, a frequency divider receiving the oscillation signal for generating a signal having a frequency divided by a given frequency division ratio, a phase detector means receiving an input signal and the frequency-divided signal for generating a phase difference signal, and a phase output means receiving the phase difference signal for outputting the control signal to the controlled oscillator. The phase detector means generates a first phase difference signal starting at the input signal and terminating at one of a rising edge and a falling edge of the frequency-divided signal. The phase detector means also generates a second phase difference signal having a constant pulse width in an interval period between each pair of adjacent first phase difference signals without substantially overlapping the first phase difference signal. The phase output means responds to the first phase difference signal to generate a first control signal for changing the oscillation frequency of the controlled oscillator in a first direction, and also responds to the second phase difference signal to generate a second control signal for changing the oscillation frequency of the controlled oscillator in a second direction opposite to the first direction.

The above and other objects, features and advantages of the present invention will be apparent from the following description of preferred embodiments of the invention with reference to the accompanying drawings.

DESCRIPTION OF THE PREFERRED EMBODIMENTS

Figure 1:
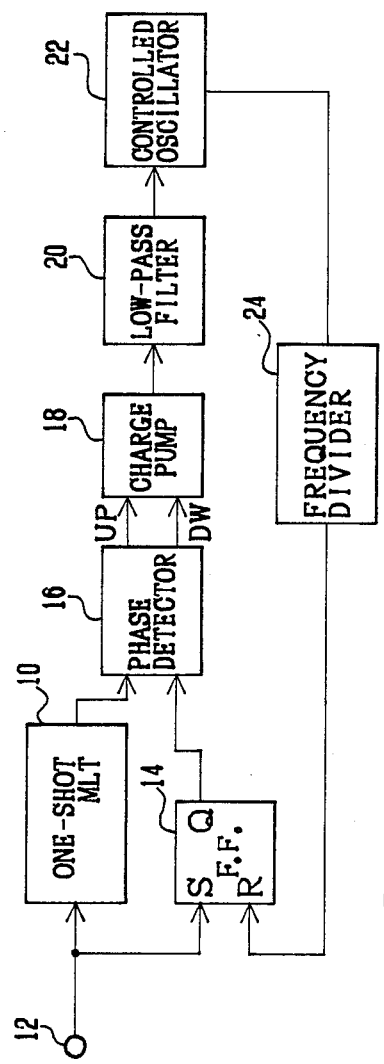
FIG. 1 is a block diagram of a typical conventional phase-locked loop circuit.

Referring to FIG. 1, there is shown a diagram of a conventional typical phase-locked loop circuit used for a data reading of a magnetic disc device. The shown circuit has a one-shot multivibrator (called "MLT" hereinafter) 10 having an input connected to an input terminal 12 for receiving a read-out data signal. The MLT 10 is triggered by a rising edge of the read-out data signal to generate a pulse signal having a pulse width of a one-fourth of a minimum input data interval To. The input terminal 12 is connected to a set input S of a reset-set flipflop (called "RS-FF" hereinafter) 14. An output of the MLT 10 and a Q output of the RS-FF 14 are connected to a phase detector 16, which in turn operates to detect a phase difference between a rising edge of the pulse signal outputted from the MLT 10 and a signal outputted from the Q output of the RR-FF 14, and then to generate a charge signal or a discharge signal in correspondence to the detected phase difference and its sign or polarity. For example, the phase detector 16 can be constituted of PC-1008C available from the NEC corporation, Japan or MC4044 available from the Motorola, Inc., U.S.A. The charge signal and the discharge signal are inputted to a so called charge pump 18, whose output is connected through a low pass filter 20 to a voltage controlled oscillator (called "VCO" hereinafter) 22. An output of the VCO 22 is connected to a frequency divider 24 of the frequency division ratio adjustable type. An output of the frequency divider 24 is connected to a reset input R of the RS-FF 14. As a whole, the shown circuit operates to follow a phase of the read-out data signal inputted through the input terminal 12.

Now, explanation will be made on operation of the circuit shown in FIG. 1 with reference to a timing chart shown in FIG. 2.

The VCO 22 is set to have a center frequency fosc as defined as follows:

fosc=(4/To)

where To is a minimum data transfer rate of the input data signal In addition, the frequency divider 24 is set at ¼ frequency division.

Figure 2:
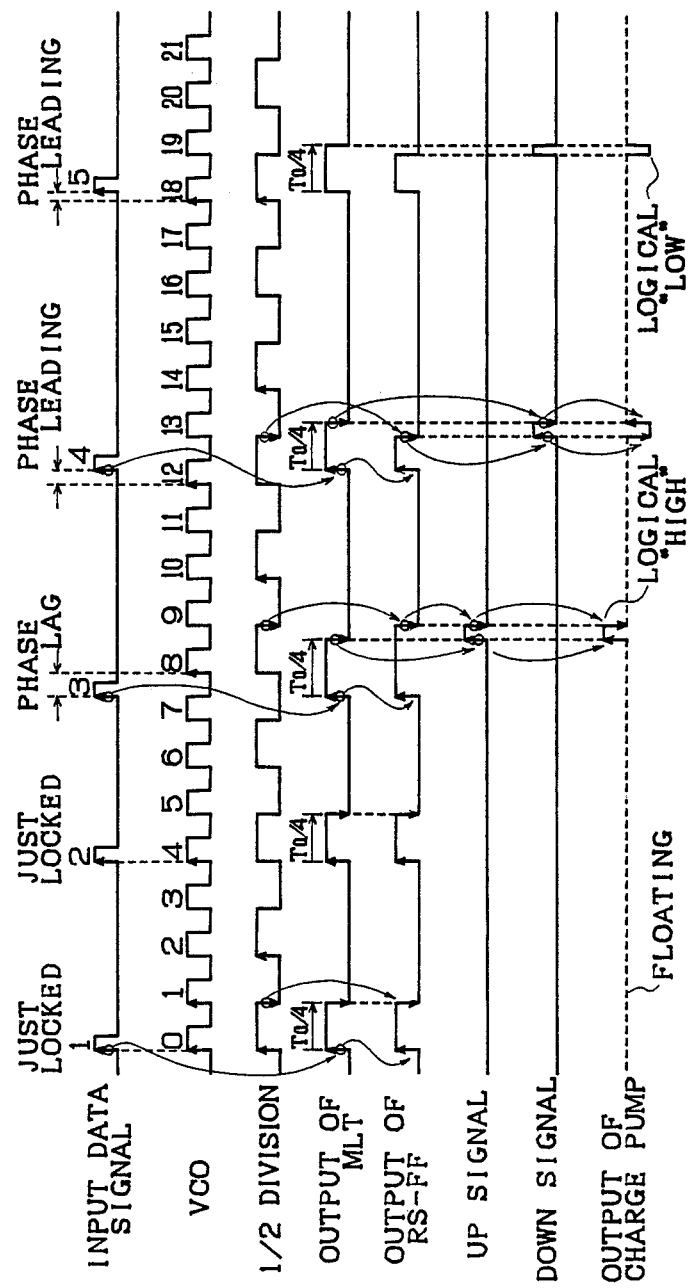
FIG. 2 is a time chart illustrating an operation of the phase-locked loop circuit shown in FIG. 1.

As shown in FIG. 2, at a rising edge of an input data signal supplied through the input terminal 12, the MLT 10 rises up its output from a low level to a high level, and RS-FF 14 also rises up its Q output from a low level to a high level. Then, the MLT 10 maintains its high level only for a period of To/4, and the RS-FF 14 will fall down its Q output to the low level at a rising edge of an oscillation signal of the VCO 22 next to an oscillation signal which has risen up when or just after or just before the input data signal supplied through the input terminal 12 had risen up. The phase detector 16 constituted of for example NEC PC-1008C or Motorola MC4044 detects a phase difference between the falling edge of the output of the MLT 10 and the falling edge of the Q output of RS-FF 15 by using the falling edge of the output of the MLT 10 ad a reference signal. The phase detector 16 generates an UP signal or a DOWN signal in accordance with the detected phase difference. In response to the UP signal or the DOWN signal, the charge pump 18 brings its output into a logical high level or a logical low level, respectively. If neither UP signal nor the DOWN signal is generated, the charge pump 18 maintains its output in a floating condition.

Specifically reviewing the example shown in FIG. 2, first and second input data signals are in a just locked condition having no phase difference. Namely, The first and second input data signals have their rising edge consistent with a rising edge of the corresponding oscillation signal of the VCO 22. Therefore, the charge pump 3 maintains its output in the floating condition, with the result that the VCO 22 maintains its oscillation frequency.

A third input data signal is delayed in phase, as shown in FIG. 2. In the case of the third input data signal, the output signal of the MLT 10 falls down before the Q output of the RS-FF 14 falls down, and therefore, the phase detector 16 generates the UP signal corresponding to the detected phase difference. As a result, the charge pump generates a logically high signal having a pulse width corresponding to that of the UP signal so that the oscillation signal of the VCO 22 , is advanced in phase so that the oscillation signal of the VCO 22 is adjusted to be in phase with the input data signal. On the other hand, fourth and fifth data signals are advanced in phase. In the case of the fourth and fifth input data signals, the Q output of the RS-FF 14 falls down before the output signal of the MLT 10 falls down, and therefore, the phase detector 16 generates the DOWN signal corresponding to the detected phase difference. As a result, the charge pump generates a logically low signal having a pulse width corresponding to that of the DOWN signal so that the oscillation signal of the VCO 22 is delayed in phase so that the oscillation signal of the VCO 22 is adjusted to be in phase with the input data signal.

In the case that the above mentioned phase-locked loop circuit is incorporated in a data reading circuit for a floppy disc device, a data transfer rate is changed as 125 Kbps, 250 Kbps and 500 Kbps, respectively. In order to comply with the change of the data transfer rate, therefore, the frequency division ratio of the frequency divider 24 is selectively set to 8, 4 and 2, respectively, and at the same time, the MLT 10 is set so that the logically high level period of each one-shot pulse can be adjusted as 2.0 μs, 1.0 μs and 0.5 μs, respectively.

In the 250 Kbps mode which is relatively low in the data transfer rate, the conventional circuit has been encountered with such a disadvantage that the reading precision is deteriorated due to a phase error attributable to a quantization error (one clock) generated in a digital counter. In order to prevent the deterioration of the reading precision, therefore, is was a conventional manner to use an IC multivibrator whose output width can be adjusted by an external resister or capacitor circuit. A typical example of such an IC multivibrator is 74121TTLIC available from the Texas Instruments Inc.

However, for recent floppy disc devices having a high speed data transfer rate such as 1 Mbps and 2 Mbps, and for recent hard disc devices having a high speed data transfer rate of 5 Mbps or more, the conventional phase-locked loop circuits have included one one-shot multivibrator for each of all the data transfer rates. Therefore, in the case that the phase-locked loop circuit is used in cooperation with the magnetic devices having different but high data transfer rates, the phase-locked loop circuit has to include a corresponding number of one-shot multivibrators, and accordingly, a correspondingly number of sets of external resister and capacitor have to be provided.

In addition, in the proximity of zero phase difference, the UP signal and the DOWN signal of the phase detector has a very narrow pulse width. However, a pulse signal having a very narrow pulse width will disappear while it is transferred through the charge pump to an input of the low pass filter, if the signal transfer system does not have a sufficient transmission power. Because of this, there exists a region in which a phase difference cannot apparently be detected, and therefore, after the phase-locked loop circuit is locked, a jitter appears in the oscillation frequency of the VCO 22, with the result that the circuit becomes unstable.

Figure 3:
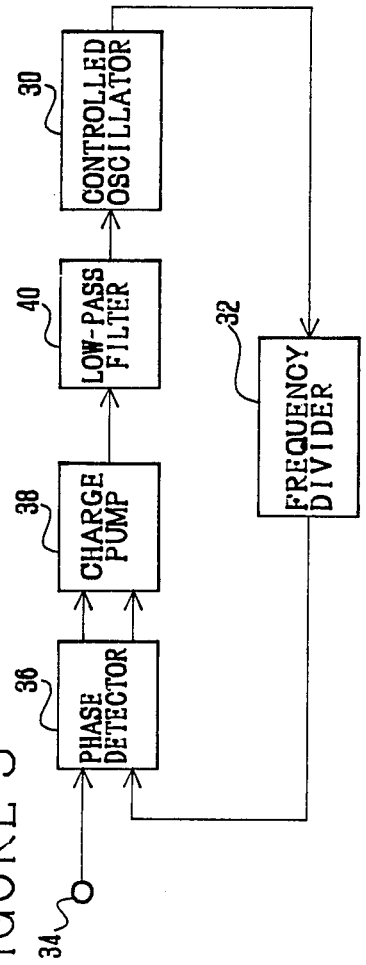
FIG. 3 is a block diagram of one embodiment of a phase-locked loop circuit embodying the present invention.

Referring to FIG. 3, there is shown a block diagram of one embodiment of a phase-locked loop circuit embodying the present invention. The shown phase-locked loop circuit comprises a controlled oscillator 30 receiving a control signal for generating an oscillation signal of a frequency corresponding to the received control signal, and a frequency divider 32 receiving the oscillation signal from the controlled oscillator 30 for generating a signal having a frequency divided by a given frequency division ratio. The phase-locked loop circuit also comprises an input terminal 34 and a phase detector 36 receiving an input signal through the input terminal 34 and the frequency-divided signal for generating first and second phase difference signals. The first and second phase difference signals are inputted to a charge pump 38, where the phase difference is converted into a voltage signal, which is in turn supplied through a low filter 40 to the controlled oscillator 30. Thus, the controlled oscillator 30 generates the oscillation signal having a frequency corresponding to the voltage signal. Namely, the phase-locked loop circuit is formed as a whole.

Figure 4:
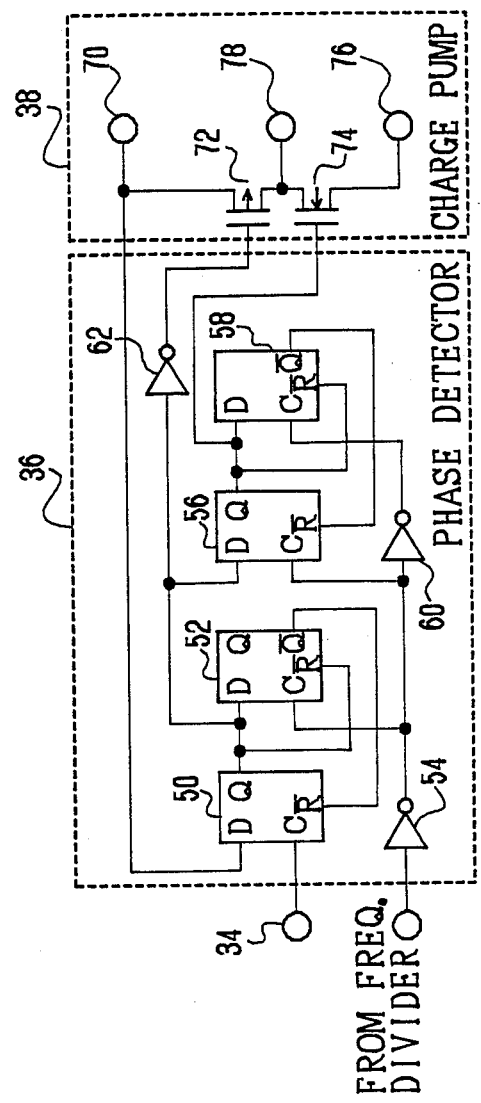
FIG. 4 is a circuit diagram of one embodiment of the phase detector and the charge pump used in the phase-locked loop circuit shown in FIG. 3.

Turning to FIG. 4, there is shown a specific circuit of the phase detector 36 and the charge pump 38. The phase detector 36 includes a D-type flipflop 50 having a data input D connected to a positive voltage supply terminal 70 and a clock input C connected to the input terminal 34 for receiving the input data signal so that a Q output of the flipflop is brought into a logically high level in response to a rising edge of the input signal. The Q output of the flipflop 50 is connected to a data input D and a reset input $\overline{R}$ of another D-type flipflop 52 having a clock input C connected to receive the output of the frequency divider 32 through an inverter 54. A $\overline{Q}$ output of the flipflop 52 is connected to a reset input $\overline{R}$ of the flipflop 50. Thus, the flipflop 50 is reset at a falling edge of the output pulse of the frequency divider 32. Namely, the flipflops 50 and 52 form an edge detector which is set at the rising edge of the input signal and reset at the falling edge of the output pulse of the frequency divider 32.

The Q output of the flipflop 50 is connected to a data input D of a third D-type flipflop 56, which has a clock input C connected to the output of the inverter 54 so that a Q output of the flipflop 56 is brought into a logically high level in response to a rising edge of an inverted signal of the frequency-divided output signal of the frequency divider 32 (namely, a falling edge of the non-inverted frequency-divided output signal of the frequency divider 32) after the Q output of the flipflop 50 has been rendered to a high level. The Q output of the flipflop 56 is connected to a data input D and a reset input $\overline{R}$ of a fourth D-type flipflop 58 having a clock input C connected to receive the output of the inverter 54 through another inverter 60 so that the flipflop 58 is set by a rising edge of the non-inverted frequency-divided output signal of the frequency divider 32. A $\overline{Q}$ output of the flipflop 58 is connected to a reset input $\overline{R}$ of the flipflop 56 so that at the moment the flipflop 58 is set by a rising edge of the non-inverted frequency-divided output signal of the frequency divider 32, the flipflop 56 is reset by the $\overline{Q}$ output of the flipflop 58 and thereforem immediately thereafter, the Q output of the flipflop 56 is brought into a low level and the output of the flipflop 58 is also brought into a low level. Thus, the flipflop 56 and 58 form an edge detector which is set at the falling edge of the frequency divider 32 and reset at the rising edge of the frequency divider 32.

The Q output of the flipflop 50 forms an UP signal of the phase detector 36 and the Q output of the flipflop 56 forms a DOWN signal of the phase detector 36.

The charge pump 38 includes a p-channel MOSFET 72 and a n-channel MOSFET 74 connected in series between the positive voltage supply terminal 70 and a negative voltage supply terminal 76. Namely, the p-channel MOSFET 72 is connected at its source to the positive voltage supply terminal 70 and at its drain to a drain of the n-channel MOSFET 74 and to an output terminal 78. A source of the n-channel MOSFET 74 is connected to the negative voltage supply terminal 76. Accordingly, the charge pump is in the form of a CMOS circuit. Therefore, the Q output of the flipflop 50 is connected through an inverter 62 to a gate of the p-channel MOSFET 72, and the Q output of the flipflop 56 is connected directly to a gate of the n-channel MOSFET 74.

Figure 5:
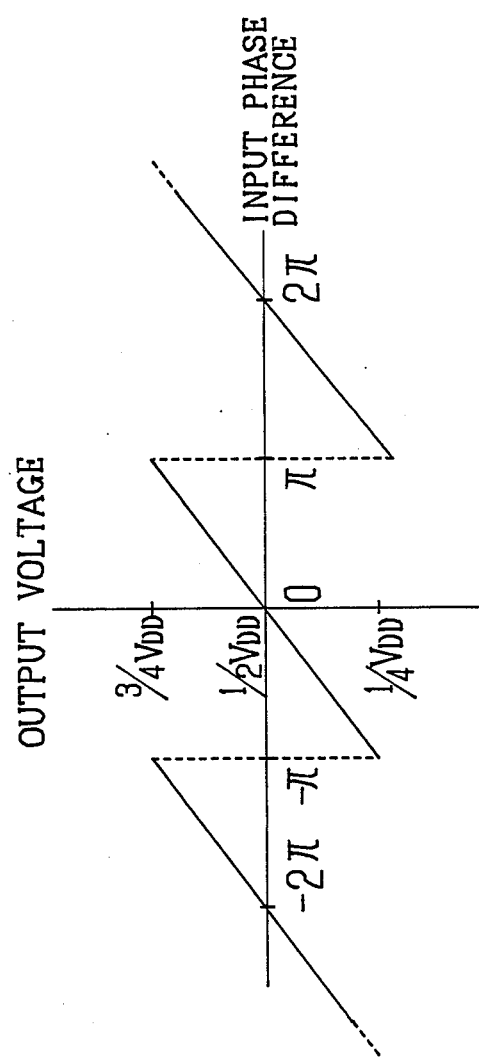
FIG. 5 illustrates a phase difference detection characteristics realized in the circuit shown in FIG. 3.

The above mentioned circuit has the phase detection characteristics as shown FIG. 5, in which the output voltage indicates an averaged or integrated voltage at the output terminal 78.

Now, explanation will be made on operation of the circuit shown in FIGS. 3 and 4 with reference to a timing chart shown in FIG. 6.

Figure 6:
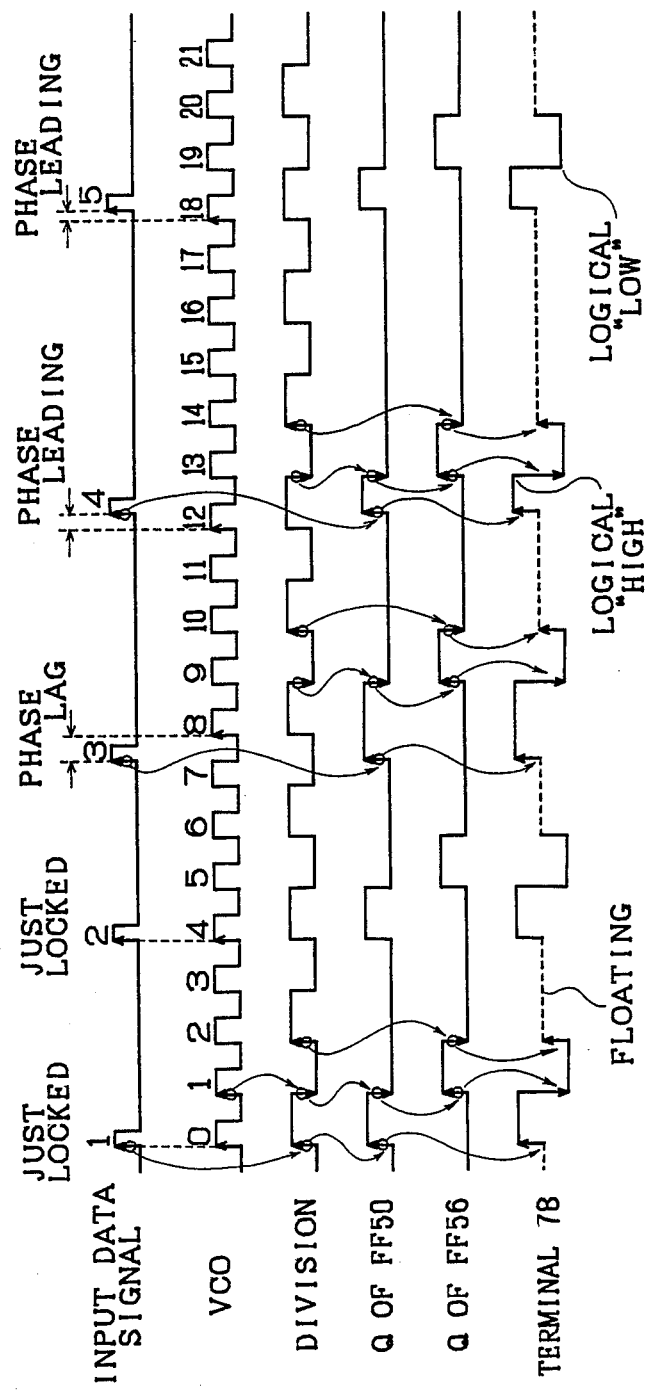
FIG. 6 is a time chart illustrating an operation of the embodiment of the phase-locked loop circuit shown in FIGS. 3 and 4.

As shown in FIG. 6, at a rising edge of an input data signal supplied through the input terminal 34, the flipflop 50 rises up its Q output from a low level to a high level, and then falls down its Q output at a falling edge of the output of the frequency divider 32, namely, at a rising edge of the oscillation signal firstly outputted from the controlled oscillator 30 after the flipflop 50 has been set. At the same rising edge of the oscillation signal firstly outputted from the controlled oscillator 30 after the flipflop 50 has been set, the flipflop 56 rises up its Q output to a high level, and then, falls down its Q output at a rising edge of the output of the frequency divider 32, namely, at a rising edge of an oscillation signal next to the oscillation signal firstly outputted from the controlled oscillator 30 after the flipflop 50 has been set. Therefore, the charge pump 38 operates to bring its terminal 78 to a logically high level only for a time period in which the Q output of the flipflop 50 is at the logically high level and to a logically low level only for a time period in which the Q output of the flipflop 56 is at the logically high level. In the other time period, the charge pump maintains its output terminal 78 in a high impedance condition, i.e., in a floating condition. Thus, controlled oscillator 30 operates to change the oscillation frequency so that a high level period of the output terminal 78 is made consistent with a low level period of the output terminal 78.

Specifically reviewing the example shown in FIG. 6, first and second input data signals are in a just locked condition having no phase difference. Namely, The first and second input data signals have their rising edge consistent with a rising edge of the corresponding oscillation signal of the controlled oscillator 30. In this case, the charge pump 38 maintains its output terminal 78 in the floating condition, with the result that the controlled oscillator 30 remains its oscillation frequency.

A third input data signal is delayed in phase, as shown in FIG. 6. In this case, the high level period of the Q output of the flipflop 50 is longer than that of the Q output of the flipflop 56 by a time period corresponding to a delayed time, and therefore, the averaged voltage of the output terminal of the charge pump 38 is correspondingly increased. Therefore, the oscillation signal of the controlled oscillator 30 is advanced in phase so that the oscillation signal is adjusted to be in phase with the input data signal.

On the other hand, fourth and fifth data signals are advanced in phase. In this case, therefore, the high level period of the Q output of the flipflop 50 is shorter than that of the Q output of the flipflop 56 by a time period corresponding to a delayed time, and therefore, the averaged voltage of the output terminal of the charge pump 38 is correspondingly decreased. Therefore, the oscillation signal of the controlled oscillator 30 is delayed in phase so that the oscillation signal is adjusted to be in phase with the input data signal.

Incidentally, the phase detector 36 has a periodicity of $2\pi$ as shown in the phase detection characteristics of FIG. 4. Therefore, in order to prevent the oscillation frequency from being erroneously locked at a frequency defined by a period obtained by multiplying or dividing the input data transfer period To by any integer, the oscillation frequency fosc of the controlled oscillator 30 is set as follows:

$$1/(2To) < (1/N) fosc < 2/To \qquad (1)$$

where N is a frequency division ratio of the frequency divider.

Figure 7:
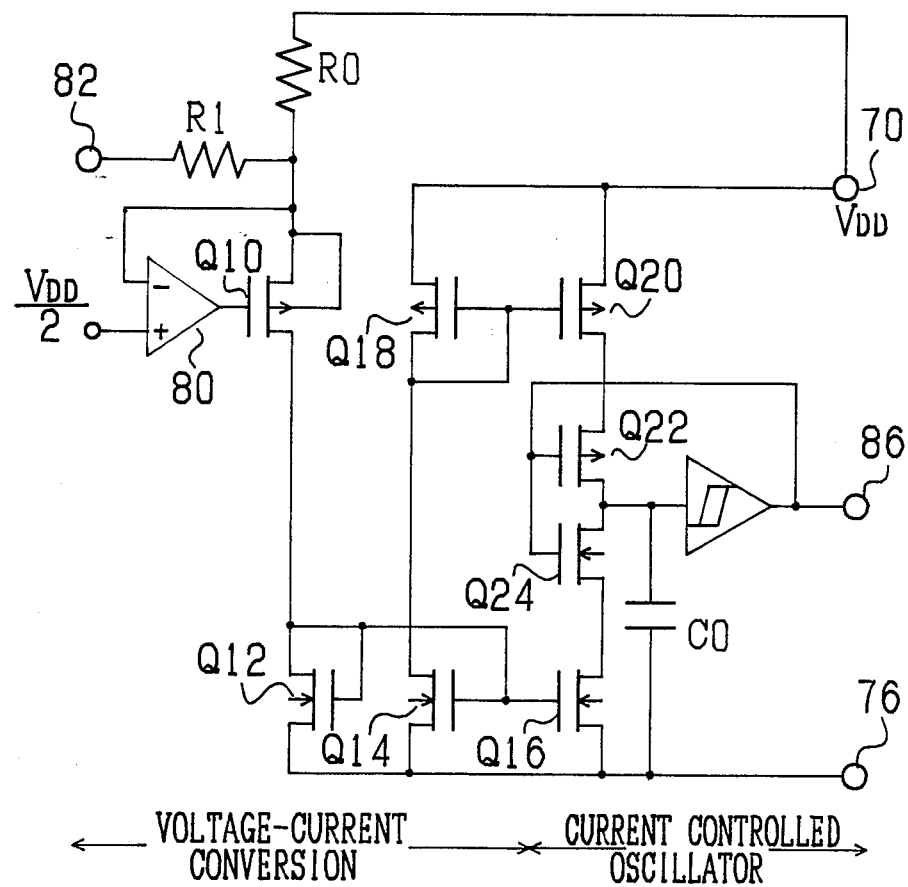
FIG. 7 is a circuit diagram of the controlled oscillator used in the in the phase-locked loop circuit shown in FIG. 3.

For this purpose, as shown in FIG. 7, a voltage-current conversion circuit can be combined with a current controlled oscillator shown in Japanese Patent Application Laid-open No. Sho 61-244115 published on Oct. 30, 1986. The shown circuit includes an operational amplifier 80 having a non-inverted input connected to $V_{DD}/2$ (one half of a voltage $V_{DD}$ at the positive voltage supply terminal 70). An output of the operational amplifier 80 is connected to a gate of a p-channel MOSFET Q10, which has a back gate connected to a source of the MOSFET Q10 itself. The source of the MOSFET Q10 is also connected to an inverted input of the operational amplifier 80 and through a resister R0 to the positive voltage supply terminal 70. Further, the source of the MOSFET Q10 is also connected through a resister R1 to an input terminal 82 of the controlled oscillator 30. A drain of the MOSFET Q10 is connected to the negative voltage supply terminal 76 (0 V) through a n-channel MOSFET Q12 having a gate connected to a drain of the MOSFET Q12 itself. With the above mentioned arrangement, the operational amplifier 80 and the MOSFET Q10 form a voltage follower which maintains the source of the MOSFET Q10 at $V_{DD}/2$.

The drain of the MOSFET Q12 is connected to a gate of each of a pair of n-channel MOSFETs Q14 and Q16 so that a current mirror circuit is formed. Sources of the MOSFETs Q14 and Q16 are connected to the negative voltage supply terminal 76, and a drain of the MOSFET Q14 is connected to a drain of a p-channel MOSFET Q18 whose gate is connected to the drain of the MOSFET Q18 itself and a gate of a p-channel MOSFET Q20. Sources of the MOSFETs Q18 and Q20 are connected to the positive voltage supply terminal 70. A drain of the MOSFET Q20 is connected to a source of a p-channel MOSFET Q22, whose drain is connected to a drain of a n-channel MOSFET Q24, whose source is connected to a drain of the MOSFET Q16. A connection node between the MOSFETs Q22 and Q24 is connected to an input of a schmitt trigger circuit 84 having an output connected to an oscillation output terminal 86 and a gate of each of the MOSFETs Q22 and Q24. In addition, a capacitor Co is connected between the negative voltage supply terminal 76 and the connection node between the MOSFETs Q22 and Q24.

In the above mentioned circuit, assuming that the input voltage signal inputted at the input terminal 82 is Vin, a current I flowing through the MOSFET Q10 is expressed as follows:

$$I = V_{DD}/(2R0) - (1/R1)(V_{DD}/2 - V_{in})$$

The current I is inputted through the current mirror circuit composed of MOSFETs Q12 and Q14 to the current controlled oscillator.

In the circuit as mentioned above, the condition (1) can be satisfied by setting the values of the resisters R0 and R1 so as to fulfill the following condition:

R1 > 2R0
$T_o = 1/(N \cdot f_{osc})$
$f_{osc} = V_{DD}/(V_{SH} - V_{SL}) \ 4 \ Co \ RO$ where $V_{SH}$ and $V_{SL}$ are maximum and minimum voltages of the hysterics voltage of the Schmitt trigger circuit 84, and Co is the capacitance of the capacitor Co.

Figure 8:
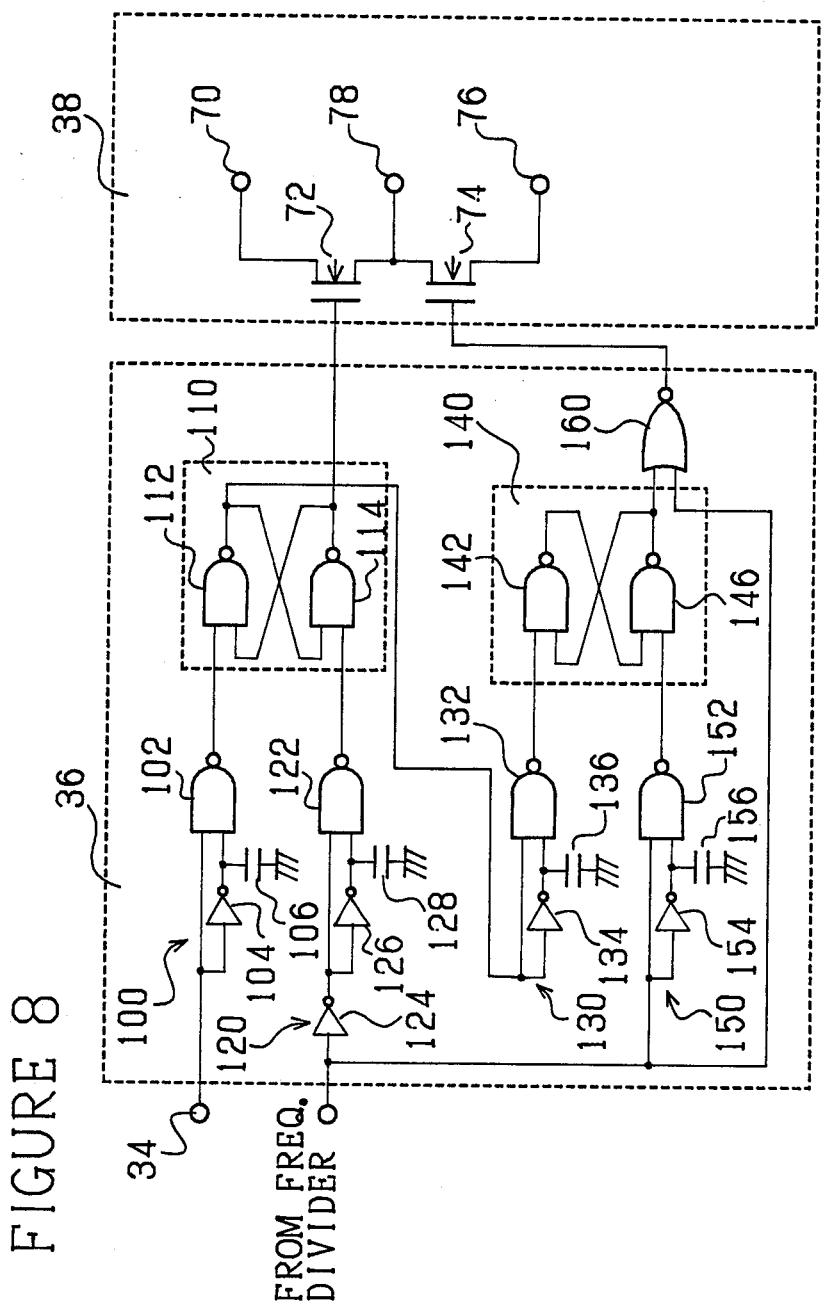
FIG. 8 is a circuit diagram of another embodiment of the phase detector and the charge pump used in the phase-locked loop circuit shown in FIG. 3

Turning to FIG. 8, there is shown another embodiment of the phase detector 36. The shown phase detector comprises a first shaping circuit 100 including a NAND gate 102 having a first input connected to directly receive the input signal through the input terminal 34. A second input of the NAND gate 102 is connected to the input terminal 34 through a delay circuit composed of an inverter 104 and a capacitor 106. Thus, the input signal supplied through the input terminal 34 is shaped to a pulse having a pulse width corresponding to a delay time given by the delay circuit composed of the inverter 104 and the capacitor 106. The shaped pulse is inputted to a set input of a reset-set flipflop 110 composed of a pair of NAND gates 112 and 114 connected in a well known manner. The frequency-divided signal from the frequency divider 32 is supplied through a second shaping circuit 120 to a reset input of the flipflop 110. The second shaping circuit 120 includes a NAND gate 122 having a first input connected to receive the frequency-divided signal through an inverter 124. A second input of the NAND gate 122 is connected to an output of the inverter 124 through a delay circuit composed of an inverter 126 and a capacitor 128. A $\overline{Q}$ output of the flipflop 110 is connected to the gate of the MOSFET 72 of the charge pump 38.

A Q output of the flipflop 110 is connected to a third shaping circuit 130 including a NAND gate 132 having a first input connected to directly receive the Q output of the flipflop 110. A second input of the NAND gate 132 is connected to the Q output of the flipflop 110 through a delay circuit composed of an inverter 134 and a capacitor 136. The shaped pulse outputted from the NAND gate 132 is inputted to a set input of a another reset-set flipflop 140 composed of a pair of NAND gates 142 and 144 connected in a well known manner. Further, the frequency-divided signal from the frequency divider 32 is supplied through a fourth shaping circuit 150 to a reset input of the flipflop 140. The fourth shaping circuit 150 includes a NAND gate 152 having a first input connected to receive the input signal through the input terminal 34. A second input of the NAND gate 152 is connected to the input terminal 34 through a delay circuit composed of an inverter 156 and a capacitor 158. A $\overline{Q}$ output of the flipflop 140 is connected to a first input of a NOR gate 160 has a second input connected to the input terminal 34 to receive the input signal. A output of the NOR gate 160 is connected to the gate of the MOSFET 74 of the charge pump 38.

In the above mentioned phase detector shown in FIG. 8, a shaping circuit is provided before each input of each of the flipflops 110 and 140. Therefore, a malfunction caused by noises in the form of a impulse can be prevented.

The invention has thus been shown and described with reference to the specific embodiments. However, it should be noted that the present invention is in no way limited to the details of the illustrated structures but changes and modifications may be made within the scope of the appended claims.

I claim:

1. A phase-locked loop circuit comprising a controlled oscillator receiving a control signal for generating an oscillation signal of a frequency corresponding to the received control signal, a frequency divider receiving said oscillation signal for generating a frequency-divided signal having a frequency divided by a given frequency division ratio, a phase detector means receiving an input signal and said frequency-divided signal for generating a phase difference signal, and a phase output means receiving said phase difference signal for outputting said control signal to the controlled oscillator, said phase detector means generating a first phase difference signal starting at the input signal and terminating at one of a rising edge and a falling edge of said frequency-divided signal, and also generating a second phase difference signal having a constant pulse width in an interval period between each pair of adjacent first phase difference signals without substantially overlapping said first phase difference signal, said phase output means responding to said first phase difference signal to change the oscillation frequency of said controlled oscillator in a first direction, and also responding to said second phase difference signal to change the oscillation frequency of said controlled oscillator in a second direction opposite to said first direction.

2. A phase/locked loop circuit claimed in claim 1 wherein said phase detector means includes;
    a first edge detector set at the rising edge of said input signal and reset at the falling edge of said frequency-divided signal of said frequency divider; and
    a second edge detector set at the falling edge of said frequency-divided signal of said frequency divider and reset at the rising edge of the frequency-divided signal appearing next to said frequency-divided signal at the falling edge of which said second edge detector had been set.

3. A phase-locked loop circuit claimed in claim 2 wherein said first edge detector includes;
  a first D-type flipflop having a data input D connected to a positive voltage supply terminal and a clock input C connected to receive said input signal so that a Q output of the first flipflop is brought into a logically high level in response to a rising edge of said input signal, said Q output of the first flipflop giving said first phase difference signal; and
  a second D-type flipflop having a data input D and a reset input R which are connected to said Q output of said first flipflop, said second flipflop having a clock input C connected to receive the output of said frequency divider through an first inverter and a $\overline{Q}$ output connected to a reset input R of said flipflop;
  so that said first flipflop is reset at a falling edge of said frequency-divided signal of said frequency divider.

4. A phase-locked loop circuit claimed in claim 3 wherein said second edge detector includes;
  a third D-type flipflop having a data input D connected to said Q output of said first flipflop and a clock input C connected to the output of said first inverter so that a Q output of said flipflop is brought into a logically high level in response to a rising edge of an inverted signal of said frequency-divided signal of said frequency divider after said Q output of said first flipflop has been rendered to a high level, said Q output of said third flipflop giving said second phase difference signal; and
  a fourth D-type flipflop having a data input D and a reset input R which are connected to said Q output of said third flipflop, said fourth flipflop having a clock input C connected to receive the output of the first inverter through another inverter so that said fourth flipflop is set by a rising edge of the frequency-divided signal of said frequency divider, a $\overline{Q}$ output of said fourth flipflop being connected to a reset input R of said third flipflip.

5. A phase-locked loop circuit claimed in claim 4 wherein said phase output means includes a charge pump composed of a p-channel MOSFET having a source connected to said positive voltage supply terminal and a drain connected to an output terminal for generating said control signal, and a n-channel MOSFET having a source connected to a negative voltage supply terminal and a drain connected to said output terminal, a gate of said p-channel MOSFET being connected through a third inverter to said Q output of said first flipflop and a gate of said n-channel MOSFET being connected to said Q output of said third flipflop.

6. A phase-locked loop circuit claim 2 wherein said first edge detector includes:
  a first shaping circuit including a first NAND gate having a first input connected to directly receive said input signal and a second input connected to receive said input signal through a first delay circuit so as to generate a first pulse having a pulse width corresponding to a delay time given by the first delay circuit;
  a second shaping circuit including a second NAND gate having a first input connected to receive through an inverter 124 said frequency-divided signal and a second input connected to an output of said inverter through a second delay circuit so as to generate a second pulse having a pulse width corresponding to a delay time given by the second delay circuit; and
  a first reset-set flipflop having a set input connected to receive said first pulse and a reset input connected to receive said second pulse for generating said first phase difference signal.

7. A phase-locked loop circuit claimed in claim 6 wherein said second edge detector includes:
  a third shaping circuit including a third NAND gate having a first input connected to a Q output of said first flipflop and a second input connected to the Q output of said first flipflop through a third delay circuit so as to generate a third pulse having a pulse width corresponding to a delay time given by the third delay circuit;
  a fourth shaping circuit including a fourth NAND gate having a first input connected to receive said frequency-divided signal and a second input connected to receive said frequency-divided signal through a fourth delay circuit so as to generate a fourth pulse having a pulse width corresponding to a delay time given by the fourth delay circuit;
  a second reset-set flipflop having a set input connected to receive said third pulse and a reset input connected to receive said fourth pulse; and
  a NOR gate having a first input connected to a $\overline{Q}$ output of said second flipflop and a second input connected to receive said frequency-divided signal for generating said second phase difference signal.

8. A phase-locked loop circuit claimed in claim 7 wherein said phase output means includes a charge pump composed of a p-channel MOSFET having a source connected to said positive voltage supply terminal and a drain connected to an output terminal for generating said control signal, and a n-channel MOSFET having a source connected to a negative voltage supply terminal and a drain connected to said output terminal, a gate of said p-channel MOSFET being connected to a $\overline{Q}$ output of said first flipflop and a gate of said n-channel MOSFET being connected to said output of said NOR gate.

9. A phase-locked loop circuit comprising a controlled oscillator receiving a control signal for generating an oscillation signal of a frequency corresponding to the received control signal, a frequency divider receiving said oscillation signal for generating a frequency-divided signal having a frequency divided by a given frequency division ratio, a phase detector means receiving an input signal and said frequency-divided signal for controlling the oscillation frequency of said controlled oscillator to eliminate a phase difference between said input signal and said frequency-divided signal, said phase detector means generating a first pulse signal starting at said input signal and terminating at one of a rising edge and a falling edge of said frequency-divided signal, and a second pulse signal starting from the termination of said first pulse signal and terminating at a rising edge of the frequency-divided signal appearing next to said frequency-divided signal at the falling edge of which said first pulse had terminated, said controlled oscillator operating to change the oscillation frequency in a first direction for a period in which said first pulse signal is active, said controlled oscillator also operating to change the oscillation frequency in a second direction opposite to said first direction for a period in which said second pulse signal is active, and said controlled oscillator also operating to maintain the oscillation frequency as it is for a period in which both of said first and second pulse signals are inactive.

* * * * *